(12) United States Patent
Son et al.

(10) Patent No.: US 7,026,201 B2
(45) Date of Patent: Apr. 11, 2006

(54) METHOD FOR FORMING POLYCRYSTALLINE SILICON THIN FILM TRANSISTOR

(75) Inventors: Kyoung Seok Son, Seoul (KR); Myung Kwan Ryu, Kyoungki-do (KR); Jae Chul Park, Seoul (KR); Eok Su Kim, Seoul (KR); Jun Ho Lee, Kyoungki-do (KR); Se Yeoul Kwon, Seoul (KR); Jang Soon Im, Kyoungki-do (KR)

(73) Assignee: Boe Hydis Technology Co., Ltd, Kyoungki-do (KR)

( * ) Notice: Subject to any disclaimer, the term of this patent is extended or adjusted under 35 U.S.C. 154(b) by 0 days.

(21) Appl. No.: 11/085,953

(22) Filed: Mar. 22, 2005

(65) Prior Publication Data

US 2006/0051904 A1    Mar. 9, 2006

(30) Foreign Application Priority Data

Sep. 8, 2004    (KR) ...................... 10-2004-0071602

(51) Int. Cl.
*H01L 21/336* (2006.01)
(52) U.S. Cl. ................................... 438/166
(58) Field of Classification Search ........ 438/149, 438/161, 166
See application file for complete search history.

(56) References Cited

U.S. PATENT DOCUMENTS

| | | | |
|---|---|---|---|
| 6,506,669 B1 * | 1/2003 | Kuramasu et al. | 438/586 |
| 6,858,512 B1 * | 2/2005 | Morimoto et al. | 438/384 |
| 2004/0248345 A1 * | 12/2004 | Chang | 438/166 |
| 2005/0032338 A1 * | 2/2005 | Chen | 438/486 |

* cited by examiner

*Primary Examiner*—George Fourson
(74) *Attorney, Agent, or Firm*—Timothy J Keefer; Seyfarth Shaw LLP

(57) ABSTRACT

A method for forming a polycrystalline silicon thin film transistor. The method includes the steps of: forming a polycrystalline silicon layer including multiple protrusions by crystallizing the amorphous silicon layer according to a crystallization method in which the multiple protrusions are formed due to collision between crystal grains; patterning the polycrystalline silicon layer in an active pattern which includes only two protrusions of the multiple protrusions, which are apart from each other and located at both sides of a gate electrode-forming area; applying a barrier layer on the patterned polycrystalline silicon layer while partially covering the two protrusions; and forming a source electrode and a drain electrode at the protrusions of the polycrystalline silicon layer formed at both sides of the gate electrode-forming area by ion-implanting dopants into a resultant lamination.

7 Claims, 1 Drawing Sheet

METHOD FOR FORMING POLYCRYSTALLINE SILICON THIN FILM TRANSISTOR

BACKGROUND OF THE INVENTION

1. Field of the Invention

The present invention relates to a method for manufacturing a thin film transistor liquid crystal display, and more particularly to a method for forming a polycrystalline silicon thin film transistor by using sequential lateral solidification.

2. Description of the Prior Art

As generally known in the art, a thin film transistor (hereinafter, referred to as "TFT") used as a switching element in a liquid crystal display, an organic light emitting display, etc., is an element having the most important role in performance of such flat panel display devices. Here, the mobility or current leakage, which serves as a standard for determining the performance of the TFT, largely depends on the state or structure of the semiconductor active layer, which is a passage through which charge carriers move, or the state or structure of the silicon thin film which is material of the semiconductor active layer.

Most TFTs of the current commercial liquid crystal display devices have an active layer made from amorphous silicon (hereinafter, referred to as "a-Si"). However, an a-Si TFT having an active layer made from amorphous silicon has a very low mobility of about 0.5 $cm^2/Vs$, which makes it difficult to produce all switching elements in the liquid crystal display device. In other words, driving elements for peripheral circuits of the liquid crystal display device have to operate at a very high speed, and the a-Si TFT cannot satisfy such an operation speed as required by the driving elements for peripheral circuits. Therefore, it is actually difficult to realize the driving elements for peripheral circuits by using the a-Si TFT.

Meanwhile, a polycrystalline silicon (hereinafter, referred to as "poly-Si") TFT having an active layer made from poly-Si has a relatively high mobility of about several tens to several hundreds $cm^2/Vs$, which satisfies such an operation speed as required by the driving elements for peripheral circuits. Therefore, a poly-Si layer formed on a glass substrate enables realization of not only pixel switching elements but also driving elements for peripheral circuits. Further, the poly-Si layer formed on a glass substrate eliminates the necessity for a separate module process for forming a peripheral circuit, and enables driving elements for peripheral circuits to be formed simultaneously while the pixel area is formed, thereby reducing the cost for forming the driving elements for peripheral circuits.

Further, the high mobility of the poly-Si TFT enables the poly-Si TFT to have a volume smaller than that of the a-Si TFT. Further, the driving elements for peripheral circuits and the switching element in the pixel area can be simultaneously formed through an integration process, so that it becomes easier to reduce the line width and very advantageous to obtain a high resolution which it is otherwise difficult to obtain in the a-Si TFT-LCD.

Moreover, the high current characteristic of the poly-Si TFT enables the poly-Si TFT to be proper for a driving element of an organic light emitting display device, which is a flat panel display device of the next generation. Therefore, active researches are currently concentrated on the poly-Si TFT having a poly-Si layer formed on a glass substrate.

Here, according to one of the methods for forming a poly-Si layer on a glass substrate, a-Si layer is deposited on a glass substrate and is then subjected to heat treatment, so that the a-Si layer is crystallized. However, this method may cause deformation of the glass substrate at a temperature above 600° C., thereby degrading reliability and reducing yield of the products.

Therefore, an excimer laser annealing has been proposed as a method capable of crystallizing only the a-Si layer without causing thermal damage to the glass substrate. Also, a Sequential Lateral Solidification (hereinafter, referred to as "SLS") method has been proposed.

In the SLS method, an a-Si layer and a poly-Si layer are crystallized by means of a pulse laser and a mask having a slit pattern for selectively providing transmission part, so that the layers can be crystallized in various types according to the shapes of the masks and the methods of progressing the crystallization.

Specifically, in the SLS method, a laser beam is shed through the transmission part of the mask, which includes not only the transmission part but also a non-transmission part, thereby partially melting the a-Si layer. Then, according to lapse of time, the molten part of the a-Si layer develops in a lateral direction while being converted into a poly-Si layer. Then, the above process is repeated while the substrate is moved, until the all of the a-Si layers are crystallized into the poly-Si layers. Since the SLS method can selectively crystallize only the a-Si layer without causing thermal damage to the glass substrate, the SLS method is very advantageous in the crystallization of the a-Si layer.

However, in the SLS method, while crystal grains develop, the crystal grains developing from the left side of the laser-shed area and the crystal grains developing from the right side thereof may collide with each other at a central portion of the laser-shed area, thereby forming a protrusion which stops the development of the crystal grains. Here, the protrusion has many defects because it is formed by the collision between two kinds of crystal grains having different orientations. Therefore, if a protrusion is formed in a channel area of a poly-Si TFT while the TFT is formed through crystallization of the a-Si layer using the SLS method, the protrusion largely degrades the mobility of electrons and holes when the TFT is operated. Also, if a protrusion is formed in a drain area of the poly-Si TFT, the current leakage increases. Therefore, even in a transistor having the same channel length and width, the TFT characteristic shows a large difference between the existence or absence of the protrusion, which becomes a source causing the TFT characteristic of the entire substrate to be non-uniform.

SUMMARY OF THE INVENTION

Accordingly, the present invention has been made to solve the above-mentioned problems occurring in the prior art, and an object of the present invention is to provide a method for forming a poly-Si TFT, which can prevent degradation of the mobility of electrons and holes in operation of the TFT while employing the SLS method for development of crystal grains, so that the poly-Si TFT has a uniform TFT characteristic over the entire substrate.

In order to accomplish this object, there is provided a method for forming a polycrystalline silicon thin film transistor, comprising the steps of: sequentially forming a buffer layer and an amorphous silicon layer on a glass substrate; forming a polycrystalline silicon layer including multiple protrusions by crystallizing the amorphous silicon layer according to a crystallization method in which the multiple protrusions are formed due to collision between crystal grains; patterning the polycrystalline silicon layer in an active pattern which includes only two protrusions of the multiple protrusions, which are apart from each other and located at both sides of a gate electrode-forming area; applying a barrier layer on the patterned polycrystalline silicon layer while partially covering the two protrusions; forming a source electrode and a drain electrode at the protrusions of the polycrystalline silicon layer formed at both sides of the gate electrode-forming area by ion-implanting dopants into a resultant lamination; eliminating the barrier layer; forming a gate insulating layer on the resultant lamination; and forming a gate electrode on the gate electrode-forming area between the source electrode and the drain electrode.

It is preferred that the step of forming the polycrystalline silicon layer is performed according to a sequential lateral solidification method.

It is also preferred that the barrier layer is made from one selected from the group consisting of organic dielectric material, organic resin, and photoresist. Further, the barrier layer may be applied by spin coating. Herein, in the step of applying the barrier layer, a height of a covered are and an area of an exposed area of each protrusion are adjusted by controlling a spin speed of the spin coating. Also, the barrier layer may be applied with a thickness of 10~30000 Å.

It is also preferred that, when the dopants is ion-implanted, an acceleration voltage is controlled in such a manner as to achieve a dopant distribution in which a quantity of the dopants ion-implanted gradually decreases as it becomes away from the protrusions.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

First, according to the technical principle of the present invention, an a-Si layer is crystallized into a poly-Si layer by using the SLS method, and ions with a high concentration are then selectively implanted into a protrusion formed during crystallization into the poly-Si layer, so that the protrusion becomes a source/drain electrode and is excluded from a panel area which is a passage through which electrons and holes move.

As a result, the channel area of the TFT includes pure poly-Si without the protrusion, so that the mobility of the electrons and holes is not degraded when the TFT is operated. Therefore, the present invention can provide a poly-Si TFT having a superior characteristic.

Figure 1:
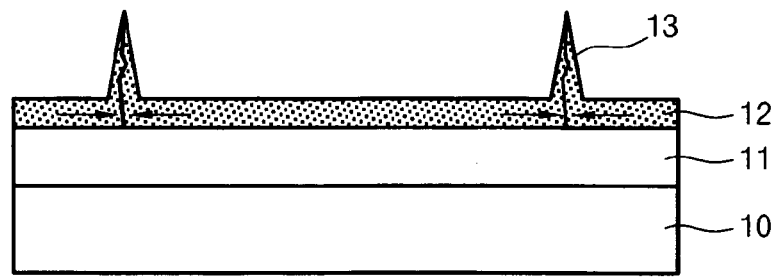
FIGS. 1 through 3 are sectional views for describing steps of a method for forming a poly-Si TFT according to the present invention, which will be described in detail hereinafter.
Figure 2:
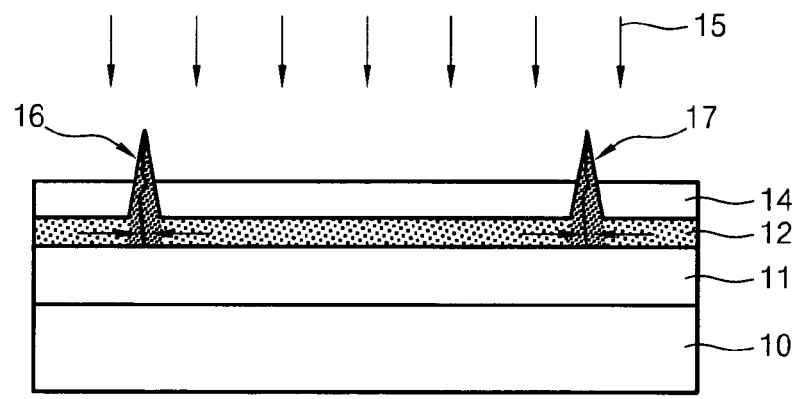
Figure 3:
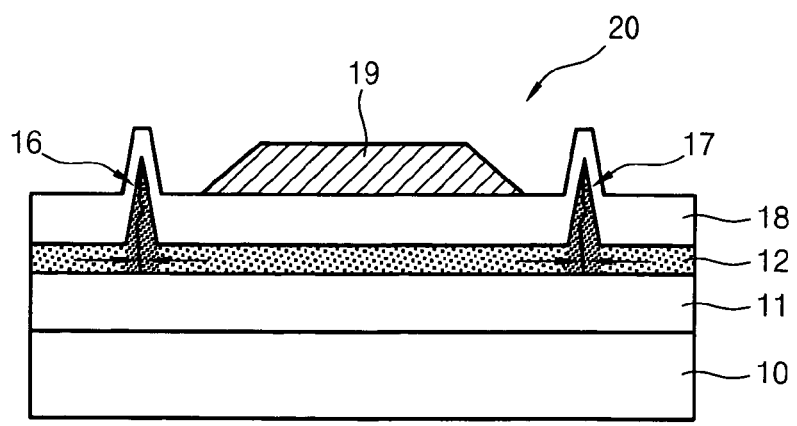

FIGS. 1 through 3 are sectional views for describing steps of a method for forming a poly-Si TFT according to the present invention, which will be described in detail hereinafter.

Referring to FIG. 1, a buffer layer 11 is formed on a transparent insulating substrate, for example, a glass substrate 10. The buffer layer 11 prevents impurities from coming into the TFT from the glass substrate 10 during the following crystallization step or high temperature heat treatment step. The buffer layer 11 is formed of a silicon-containing oxide layer or nitride layer, containing $SiO_x$, $SiO_xN_y$ or $SiN_x$, or a metal nitride layer metal oxide layer containing metal such as Al, Cu, Ag, Ti, or W.

Next, an a-Si layer is formed on the buffer layer 11 and is then crystallized to form a poly-Si layer 12. Here, it is preferable to employ the SLS method in the crystallization of the a-Si layer, in which a patterned laser beam is shed through a mask onto a portion of the a-Si layer while the substrate is sequentially moved. Then, a plurality of protrusions 13 are formed on the crystallized poly-Si layer 12 due to the principle of the crystal development in the SLS method.

Next, the poly-Si layer 12 is patterned in the shape of an active pattern. Specifically, the patterning of the poly-Si layer 12 is performed in such a manner that the active pattern includes two protrusions 13 which are apart from each other and located at both sides of a gate electrode-forming area.

Referring to FIG. 2, a barrier layer 14 used for a following ion implantation step is applied on the poly-Si layer 12 having the protrusions by means of spin coating. In this case, the barrier layer 14 is coated with a thickness not entirely covering the protrusions, for example, a thickness of 10~30000 Å, and the height of the covered are and the area of the exposed area of each protrusion are adjusted by controlling the spin speed of the spin coating. The material applied during the spin coating may be any material capable of functioning as a stopper during ion implantation, for example, organic dielectric material, organic resin or photoresist.

Next, dopants 15 are ion-implanted into the resultant substrate lamination, so that a source electrode 16 and a drain electrode 17 are formed at the protrusions of the poly-Si layer formed at both sides of the gate electrode-forming area. Here, it is preferred that the ion implantation of the dopants 15 is performed while the acceleration voltage is controlled in such a manner as to achieve an ion distribution in which the quantity of ions decreases as it becomes away from the protrusions.

As it becomes away from the protrusions, the thickness of the poly-Si layer decreases and then becomes constant. Therefore, as it becomes nearer to the protrusions, the thickness of the barrier layer decreases. Further, when ions are implanted, the dopants form a Gaussian Distribution. Therefore, by controlling the acceleration voltage in the ion implantation, a large quantity of dopants may be implanted into the area near to the protrusions and the quantity of implanted dopants may be reduced as it becomes away from the protrusions, so that a field increase in the drain area can be prevented. That is to say, formation of a Lightly Doped Drain (LDD) can be simultaneously achieved.

Also, the ion implantation of the dopants 15 performed in the way described above can reduce the concentration of oxygen and impurities introduced into the poly-Si layer 12 from the gate insulating layer, in comparison with an ion implantation without a gate insulating layer.

Referring to FIG. 3, the barrier layer is eliminated and an activation step is then performed. Thereafter, a gate insulating electrode 18 is deposited on the entire upper surface of the resultant substrate lamination, a metal layer for the gate electrode is deposited on the gate insulating layer 18, and the deposited metal layer is then patterned, thereby forming a gate electrode 19 on a portion of the gate insulating layer between the source electrode 16 and the drain electrode 17. As a result, a poly-Si TFT 20 having a coplanar structure is produced.

Herein, the poly-Si TFT 20 according to the present invention has protrusions disposed at both sides of the gate electrode 19, that is, has a channel area containing no protrusion. Therefore, in operation of the poly-Si TFT 20, the mobility of electrons and holes is not degraded. Therefore, the present invention can improve the characteristics of the poly-Si TFT while fabricating the poly-Si TFT according to the SLS method.

Thereafter, although not shown, a protective layer-forming step, a via hole-forming step, a pixel electrode-forming step, and a series of following steps are sequentially performed, so as to manufacture an array substrate of a liquid crystal display device having the poly-Si TFT.

Although the above description is given only on the case in which the poly-Si layer is crystallized according to the SLS method, it goes without saying that the present invention can be applied to other crystallization methods in which formation of a protrusion due to collision of crystal grains is observed, as well as the SLS method.

As described above, the present invention can manufacture a poly-Si TFT according to the SLS method, which has a channel area containing no protrusion, thereby preventing the characteristic of the poly-Si TFT from being degraded. Further, the present invention can simultaneously achieve a Lightly Doped Drain (LDD) in which the concentration of the dopants gradually decreases as it goes from the protrusions to the channel area. Therefore, the present invention can prevent abrupt increase in the electric field, thereby improving and stabilizing the characteristics of the TFT. Further, the poly-Si TFT does not have any protrusion at any portion of the entire substrate, so that the poly-Si TFT has an enhanced uniformity in the TFT characteristic of the substrate.

As a result, the present invention can improve the quality of a liquid crystal display employing a poly-Si TFT.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a polycrystalline silicon thin film transistor, comprising the steps of:
    sequentially forming a buffer layer and an amorphous silicon layer on a glass substrate;
    forming a polycrystalline silicon layer including multiple protrusions by crystallizing the amorphous silicon layer according to a crystallization method in which the multiple protrusions are formed due to collision between crystal grains;
    patterning the polycrystalline silicon layer in an active pattern which includes only two protrusions of the multiple protrusions, which are apart from each other and located at both sides of a gate electrode-forming area;
    applying a barrier layer on the patterned polycrystalline silicon layer while partially covering the two protrusions;
    forming a source electrode and a drain electrode at the protrusions of the polycrystalline silicon layer formed at both sides of the gate electrode-forming area by ion-implanting dopants into a resultant lamination;
    eliminating the barrier layer;
    forming a gate insulating layer on the resultant lamination; and
    forming a gate electrode on the gate electrode-forming area between the source electrode and the drain electrode.

2. The method as claimed in claim 1, wherein the step of forming the polycrystalline silicon layer is performed according to a sequential lateral solidification method.

3. The method as claimed in claim 1, wherein the barrier layer is made from one selected from the group consisting of organic dielectric material, organic resin, and photoresist.

4. The method as claimed in claim 1, wherein the barrier layer is applied by spin coating.

5. The method as claimed in claim 4, wherein, in the step of applying the barrier layer, a height of a covered area and an area of an exposed area of each protrusion are adjusted by controlling a spin speed of the spin coating.

6. The method as claimed in claim 1, wherein the barrier layer is applied with a thickness of 10~30000 Å.

7. The method as claimed in claim 1, wherein, when the dopants are ion-implanted, an acceleration voltage is controlled in such a manner as to achieve a dopant distribution in which a quantity of the dopants ion-implanted gradually decreases as it becomes away from the protrusions.

* * * * *